(12) United States Patent
Muff et al.

(10) Patent No.: US 6,534,345 B1
(45) Date of Patent: Mar. 18, 2003

(54) METHOD FOR MOUNTING A SEMICONDUCTOR CHIP ON A CARRIER LAYER AND DEVICE FOR CARRYING OUT THE METHOD

(75) Inventors: Simon Muff, Regensburg (DE); Jens Pohl, Bernhardswald (DE); Johann Winderl, Neunburg V. W (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/514,265

(22) Filed: Feb. 28, 2000

(30) Foreign Application Priority Data

Feb. 26, 1999 (DE) .......................... 199 08 474

(51) Int. Cl.[7] .............................................. H01L 21/44
(52) U.S. Cl. ...................................... 438/127; 438/108
(58) Field of Search .................. 425/110; 438/106, 438/108, 111, 112, 124, 126, 127, 118, 119

(56) References Cited

U.S. PATENT DOCUMENTS

| | | | |
|---|---|---|---|
| 5,120,678 A | | 6/1992 | Moore et al. |
| 5,203,076 A | * | 4/1993 | Banerji et al. ................ 29/840 |
| 5,394,009 A | * | 2/1995 | Loo ............................ 257/666 |
| 5,477,611 A | * | 12/1995 | Sweis et al. .................. 29/840 |
| 5,633,535 A | * | 5/1997 | Chao et al. ................. 257/778 |
| 5,763,295 A | * | 6/1998 | Tokuno et al. .............. 438/118 |
| 5,766,982 A | * | 6/1998 | Akram et al. ................. 438/51 |
| 6,046,076 A | * | 4/2000 | Mitchell et al. ............ 438/127 |
| 6,207,478 B1 | * | 3/2001 | Chung et al. ............... 438/124 |
| 6,228,679 B1 | * | 5/2001 | Chiu .......................... 438/108 |

FOREIGN PATENT DOCUMENTS

| | | |
|---|---|---|
| DE | 198 10 060 A1 | 11/1998 |
| DE | 197 29 073 A1 | 1/1999 |
| JP | 0 100 261 661 AA | 9/1998 |
| WO | WO 97/27624 | 7/1997 |

OTHER PUBLICATIONS

"Flip–Chip–Montage mit Klebern" [flip chip mounting with adhesives], EPP, Jul./Aug. 1993, p. 46.

* cited by examiner

Primary Examiner—Kamand Cuneo
Assistant Examiner—Scott Geyer
(74) Attorney, Agent, or Firm—Laurence A. Greenberg; Werner H. Stemer; Ralph E. Locher

(57) ABSTRACT

In order to mount a semiconductor chip on a carrier layer, consolidated filler material is applied between the semiconductor chip and the carrier layer. The filler material is sucked, under the application of a partial vacuum, from at least one edge section of the semiconductor chip to at least one other edge section of the semiconductor chip. As a result, a package is provided in which the filler material is essentially free of air inclusions.

5 Claims, 3 Drawing Sheets

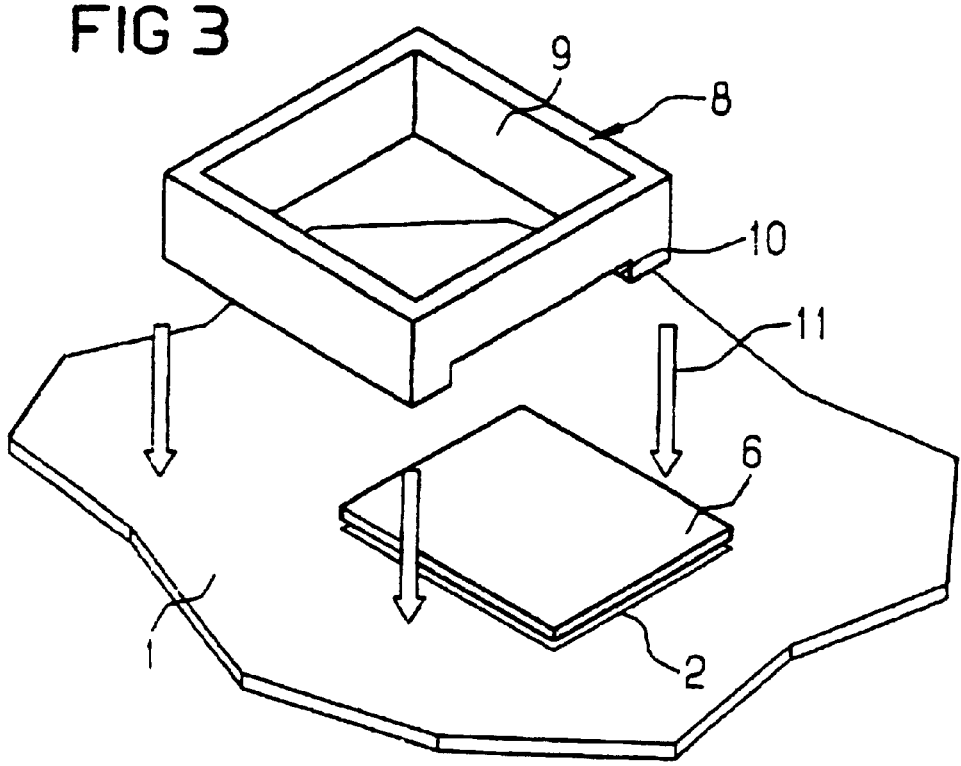
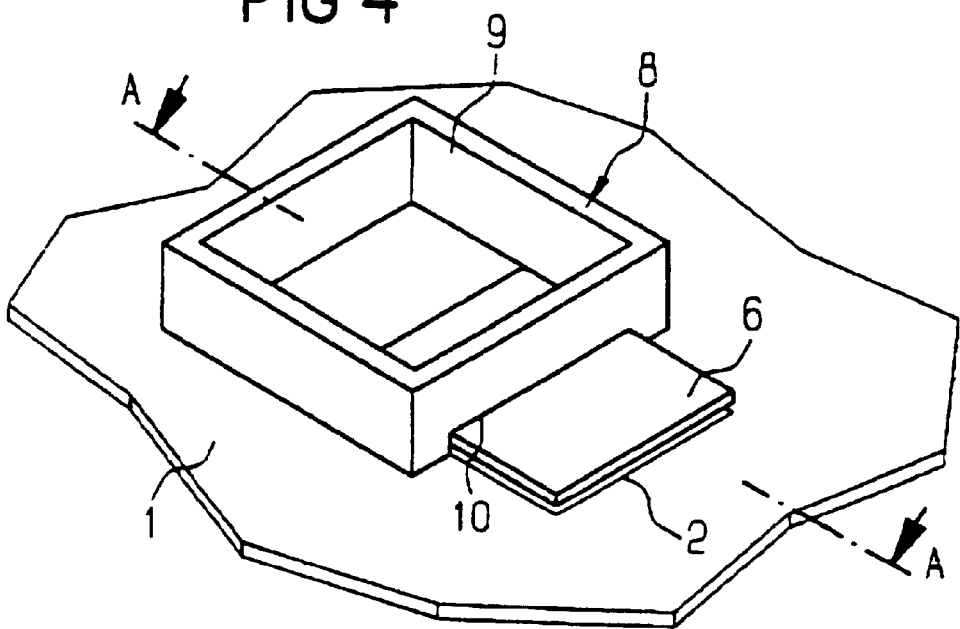

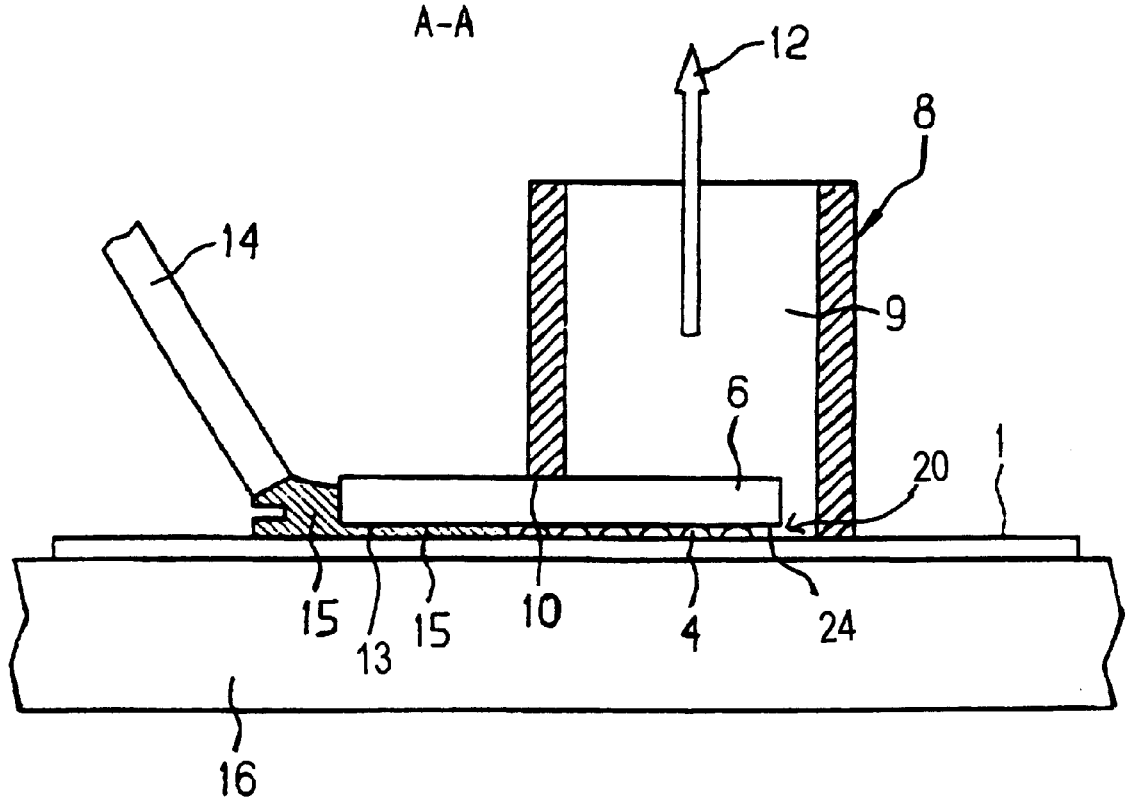

METHOD FOR MOUNTING A SEMICONDUCTOR CHIP ON A CARRIER LAYER AND DEVICE FOR CARRYING OUT THE METHOD

BACKGROUND OF THE INVENTION

1. Field of the Invention

The invention relates to a method for mounting a semiconductor chip on a carrier layer, and a device for carrying out the mounting method, and a semiconductor chip mounted on a carrier layer.

In the prior art it is known to mount semiconductor chips on a carrier layer. During the encapsulation that is carried out in this process, chip-size packages or chip-scale packages such as μBGA or generally FBGA are fabricated. For this purpose, an encapsulant, which can have properties of a filler material and adhesive properties, is introduced between a carrier layer, embodied as an interposer, and a chip or semiconductor chip. Other regions of the chip are preferably left clear so that semiconductor chips are produced that are easy to handle and contact. The known dispensing procedure is preferably carried out in such a way that bubbles or other air inclusions or voids in the encapsulant between the interposer and chip are avoided because they can considerably degrade the reliability of the package.

2. Summary of the Invention

It is accordingly an object of the invention to provide a method for mounting a semiconductor chip on a carrier layer and a device for carrying out the method which overcomes the hereinafore-mentioned disadvantages of the heretofore-known methods and devices of this general type such that packages which always operate reliably are made available.

With the foregoing and other objects in view there is provided, in accordance with the invention, a method for mounting a semiconductor chip on a carrier layer in which when the semiconductor chip is fitted onto the carrier layer the filler material is conveyed at least, partially under the application of pressure, from at least one edge section of the semiconductor chip to at least one other edge section of the semiconductor chip. In the process, the filler material is conveyed into the region between the semiconductor layer and carrier layer, preferably under the application of a partial vacuum, that is to say by sucking.

In contrast to the prior art method in which a vacuum dispenser is used to fill the volume between a semiconductor chip and a carrier layer with filler material, in the method according to the invention the filler material is moved in the region between the semiconductor chip and carrier layer in a flowing manner. This results in air bubbles being moved, together with the flow of filler material, through the region between the semiconductor chip and the carrier layer, until bubble-free filler material is located in the region between the semiconductor chip and carrier layer.

In prior art methods such as, for example, in the case of μBGA, a vacuum dispenser is used to fill the volume between a chip and an interposer with an encapsulant in a bubble-free or void-free fashion. The complete dispensing device and the carrier strip with chips have to be accommodated in a vacuum chamber. In contrast, according to the invention complicated devices are no longer necessary. Because of the generation of a flow, it is, in fact, no longer necessary to dispense the encapsulant under a vacuum. This was necessary in the prior art methods to ensure that there was no longer any air between the interposer and chip that could be included by the encapsulant.

The method enables the utilization of a device that is of simple design and that no longer requires a large vacuum chamber. The volume of the vacuum chamber which has to be evacuated during each dispensing cycle is relatively small resulting in a short cycle time, and thus in a high throughput rate of the machine intended to apply the method according to the invention.

In accordance with an additional feature of the invention, the filler material can also be introduced between the carrier layer and the semiconductor chip by means of pressurized filler material which is pressed in between the semiconductor chip and the carrier layer. However, the embodiment with a suction device provides the advantage that the filler material can easily be made available, for example, with a dispenser needle. No pressure terminals whatsoever are then necessary to feed in the filler material.

In accordance with another feature of the invention, at least one duct for conveying the flow of the filler material is formed in order to convey the filler material between the semiconductor chip and carrier layer. As a result, a defined flow of the filler material is obtained, promoting bubble-free filling of the intermediate space between the semiconductor chip and carrier layer.

Each duct that is provided for this process can have at least one inlet, located in the vicinity of one edge section of the semiconductor chip, for feeding in the filler material and can have at least one outlet, located in the vicinity of another edge section of the semiconductor chip, for discharging the filler material. This proves advantageous because edge sections of the semiconductor chip are particularly easily accessible. This makes possible a simple embodiment of the device according to the invention for performing the method according to the invention.

Here, the channels can be formed by linear application of filler material in a region between the semiconductor chip and the carrier layer. The linear application of filler material is performed preferably before the semiconductor chip is fitted onto the carrier layer. Here, the filler material can be applied onto a side of the semiconductor chip which is to face the carrier layer and/or onto a side of the carrier layer which is to face the semiconductor chip. In these embodiments of the invention, both the ducts for introducing the filler material and the filler material that is introduced into the channels are preferably formed from the same material. This results in the connection of the semiconductor chip and carrier layer in a way which is particularly reliable and easy to control.

In order to form the ducts between the semiconductor chip and the carrier layer, the filler material can be applied, for example, in a continuous line. To do this, it is possible to apply the areas of the ducts by injection molding or to apply the filler material to the desired regions using a printing method, for example using a screen printing method.

In addition to the embodiment of the ducts described above, the filler material between the semiconductor chip and carrier layer can also have sealing webs made of, for example, an elastic material. Such sealing webs can be provided on the carrier layer itself before the semiconductor chip is fitted onto the carrier layer. In addition, the carrier layer can be selected in such a way that the sealing webs can be fabricated by shaped elements in the carrier layer itself.

In addition to the filler material, spacer elements, which may be embodied for example as spacer bumps, may also be provided between the semiconductor chip and the carrier layer. Such spacer elements enable the height of an intermediate space between the semiconductor chip and the carrier layer to be set particularly easily, ensuring that there is a good flow of the filler material between the semiconductor chip and the carrier layer.

In accordance with an added feature of the invention, a suction hood is used to apply pressure to a respective edge section of the semiconductor chip, while, for the sake of simplicity, a dispensing needle can be used to introduce filler material between the semiconductor chip and the carrier layer. As a result, filler material can be introduced between the semiconductor chip and the carrier layer easily and precisely, in such a way that no air bubbles are produced.

With the foregoing and other objects in view there is provided, in accordance with the invention, a suction device for mounting a semiconductor chip on a carrier layer. For this purpose, the suction device is provided with a suction hood which is embodied in such a way that when the semiconductor chip is fitted onto the carrier layer at least one edge section of the semiconductor chip can have a partial vacuum applied to it. With this embodiment of the suction device, filler material that is in the form of a fluid or a paste and that is introduced at an edge section of the semiconductor chip can easily be sucked to another edge section. This results in the production of a flow which moves along undesired air inclusions and prevents their presence in the critical space between the semiconductor chip and the carrier layer.

In one particular refinement, the suction hood has, for this purpose, a carrier-layer contact region and a semiconductor-chip contact region that are embodied in such a way that when the semiconductor chip is fitted onto the carrier layer, the carrier-layer contact region forms an essentially airtight contact with the carrier layer, and the semiconductor-chip contact region forms an essentially airtight contact with the semiconductor chip. This enables the suction device to have a particularly good level of efficiency. Even connection regions between the semiconductor chip and carrier layer with complex shapes can also easily be subjected to the mounting method according to the invention.

A particularly simple embodiment of the suction device is obtained if the suction hood has a suction hood housing in which the semiconductor-chip contact region is embodied as a cutout.

The method according to the invention can be used to fabricate a package made with at least one semiconductor chip and at least one carrier layer or an interposer. A filler material which can in particular be consolidated and which can also have adhesive properties is provided between the semiconductor chip and the carrier layer. For this purpose, at least one consolidated region of filler material made from a flow of a material is provided in the filler material. The flow in the case of the package according to the invention runs essentially from one edge region of the semiconductor chip to another edge region. The inventive feature according to which a consolidated flow is provided in the filler material region can be detected, for example, with a micrograph on which flow lines are made visible. Flow lines can also be detected, for example, by means of elongate molecules that are provided in the filler material and that are aligned along the lines of direction of flow. The filler material region in which the consolidated flow is provided is essentially free of air inclusions.

Furthermore, in at least one edge region of a filler material region it is possible to provide elastic sealing webs. Also, in particular, elastic spacer elements may additionally be configured in order to adjust the height of the semiconductor chip on the carrier layer.

The invention solves the problem underlying the invention by virtue of the fact that the hood-like device is used to locally seal one or more adjacent chips on a carrier tape. In addition to elastic spacer bumps which are allocated between the chip and the interposer, the elastic spacer material is applied to two parallel sides, not in a bump shape but rather in a bead shape, for example, by means of a screen printing method. These bead-shaped spacers act as sealing rods that seal the volume between the chip and the interposer along the two parallel sides. The hood-like device and the sealing webs seal the volume between the chip and the interposer hermetically on three sides. Only one side of the component remains open. The dispensing needle can be run along this open side to apply an encapsulant reservoir that flows between the chip and the interposer. At the same time, a vacuum is connected via the hood-like device. In this way, a partial vacuum is generated between the chip and the interposer and it permits the encapsulant to flow in a forced or accelerated fashion.

The invention provides numerous advantages. On the one hand, it is not necessary to make available a complex, and thus expensive dispensing machine with a large vacuum chamber, Furthermore, a reel-to-reel process is possible because the vacuum is applied to the carrier tape only on a local or direct basis. Because of the pressure difference that is generated by the vacuum device it is possible for the encapsulant to flow into the volume between the chip and the interposer in a forced or accelerated fashion. This results in a short cycle time and a relatively high throughput rate during fabrication, which factors are also favored by the very small volume which still has to be evacuated. As a result, the encapsulant is introduced between the chip and the interposer without bubbles, or in a void-free fashion.

In accordance with a concomitant feature of the invention, the spacers between the chip and the interposer may be configured in such a way that bead-shaped sealing webs are produced. When these are used together with a hood-like vacuum device, it is possible to achieve a local pressure difference between the chip and interposer, with the result that the encapsulant is made to flow in a forced fashion.

Other features which are considered as characteristic for the invention are set forth in the appended claims.

Although the invention is illustrated and described herein as embodied in a method for mounting a semiconductor chip on a carrier layer and device for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 shows the carrier tape with the chip shown in FIG. 2 with a vacuum hood which is configured above the carrier tape;

FIG. 4 shows the carrier tape, the chip and the vacuum hood shown in FIG. 3 in the assembled state; and FIG. 5 shows the carrier tape, the chip and the vacuum hood shown in FIG. 4 in cross section when they are used in a process for fabricating a chip-size package.

DESCRIPTION OF THE PREFERRED EMBODIMENTS

Figure 1:
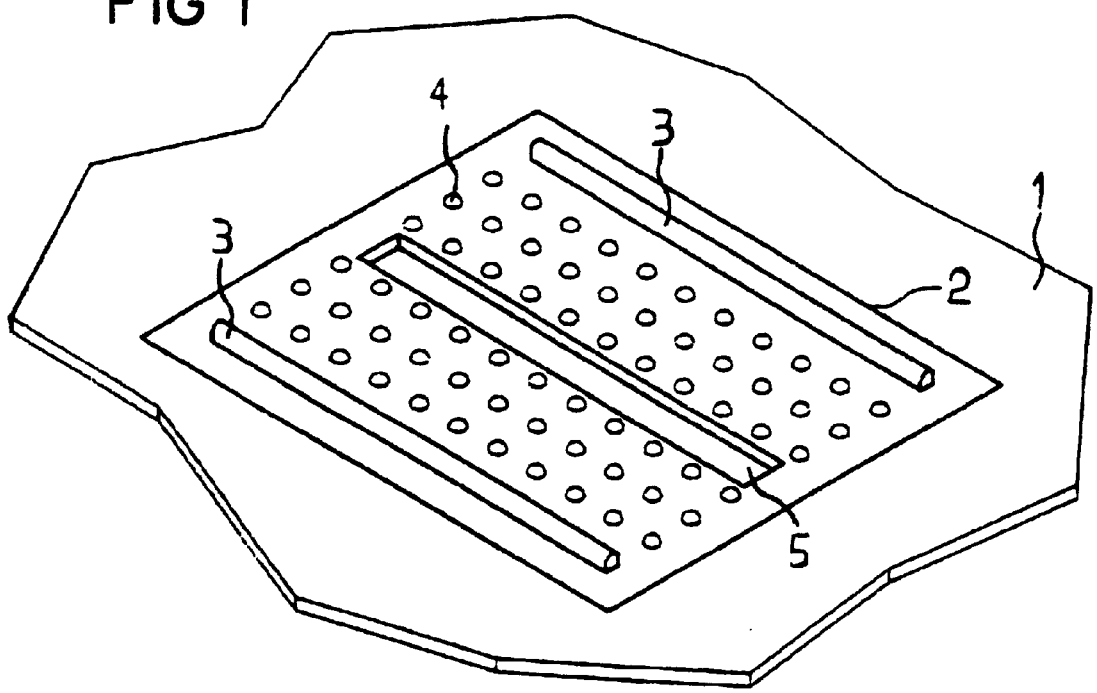
FIG. 1 shows a spatial illustration of a carrier tape.

Referring to the figures of the drawing in detail and first, particularly, to FIG. 1 thereof, there is shown a perspective view of a carrier tape 1, on which a mounting region 2 for mounting a chip (not shown in this view) is provided. The carrier tape 1 is produced from a polymer, and the mounting region 2 is formed as an essentially rectangular section on the carrier tape 1.

A sealing web 3 made of elastic polymer is provided along each of the two longitudinal sides of the mounting region 2. A plurality of spacer bumps 4 made of polymer material are configured between the sealing webs 3. A guide through-hole 5 is made as a longitudinal slit running parallel to the sealing webs 3 and is provided in the center of the mounting region 2.

Figure 2:
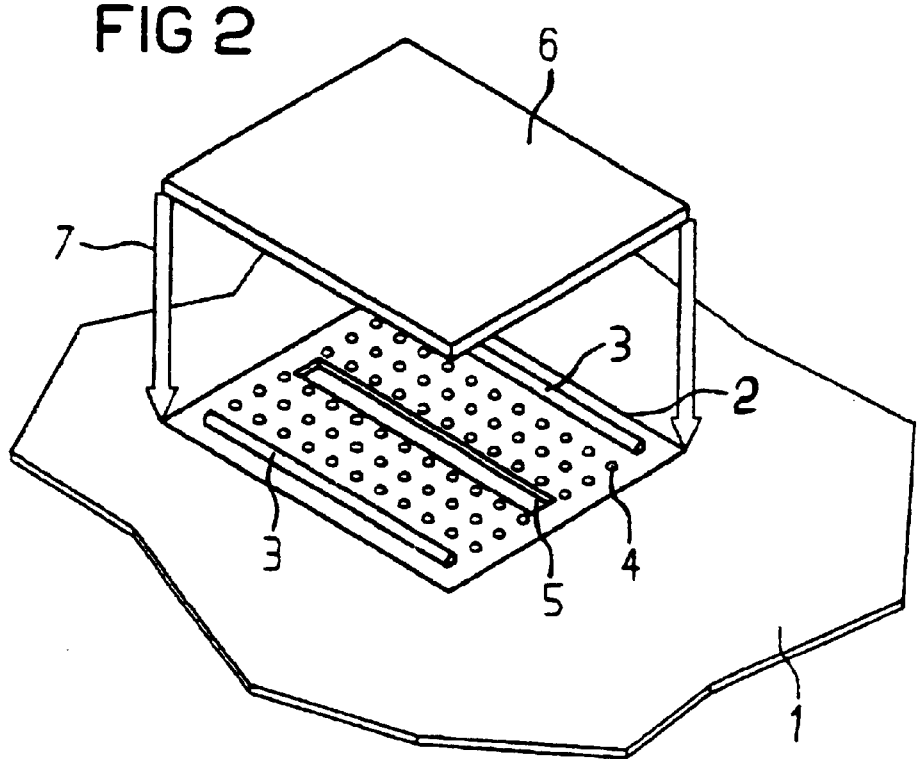
FIG. 2 shows a spatial illustration of the carrier tape shown in FIG. 1 with a chip which is configured above the carrier tape.

FIG. 2 shows the carrier tape 1 from FIG. 1 with a chip 6 that is provided above the mounting region 2. The chip 6 is fitted onto the carrier tape 1 in the direction of movement arrows 7 (only one of which is provided with a reference number in this view), with the result that the chip fills the space within the mounting region 2.

FIG. 3 shows a perspective view of the carrier tape 1 in which the chip 6 shown in FIG. 2 is in a state where it has been fitted onto the mounting region 2. A section of a suction or vacuum hood 8 which is intended to be fitted onto the chip 6 and onto the carrier tape 1 is configured in a region above the chip 6. The vacuum hood 8 is shown with a square cross section and is provided in its interior with a suction section 9 through which air can be sucked in. The vacuum hood 8 is provided with a rectangular chip cutout 10 on an outer side and the chip cutout 10 extends upward from the underside of the suction section 9. The vacuum hood 8 is fitted onto the chip 6 and onto the carrier tape 1 in the direction of movement arrows 11, and only one of the movement arrows 11 has been provided with a reference numeral in this view.

FIG. 4 shows, in an assembled state, the carrier tape 1, the chip 6, and the vacuum hood 8 that were shown in FIG. 3. As can be seen particularly well in this view, the underside of the vacuum hood 8 forms a seal with the carrier tape 1 and with the outline of the chip 6 that protrudes from the carrier tape 1. Here, the chip 6 is completely accommodated in the chip cutout 10.

FIG. 5 shows a cross section through the carrier tape 1, the chip 6, and the vacuum hood 8. The carrier tape 1, the chip 6, and the vacuum hood 8 that were shown in FIG. 4 are now shown positioned in a finishing state for providing a chip-size package according to the invention.

As can be seen particularly well in this view, the spacer bumps 4 keep free a duct 20 between the chip 6 and the carrier tape 1 which is bounded laterally by the sealing webs 3 (shown in FIGS. 1 and 2). When air is sucked in through the intake or suction section 9, which is indicated by the air arrow 12 shown in FIG. 5, a partial vacuum is produced in the interior of the duct 20 which is formed in this way.

As can be seen particularly well in FIG. 5, a dispensing needle 14 is configured at a first edge section 13 of the chip 6. A fluid encapsulant 15 emerges from the dispensing needle 14, with the result that the encapsulant 15 can enter the first edge section 13 in the region between the chip 6 and carrier tape 1. Because of the flow that can occur in the duct 20 between the chip 6 and carrier tape 1, the encapsulant 15 is sucked in and surrounds the spacer bumps 4 between the sealing webs 3. The encapsulant 15 is sucked underneath the first edge section 13 of the semiconductor chip 6 and is allowed to discharge from underneath a second edge section 24 of the semiconductor chip 6 until bubble-free encapsulant is located in the region between the semiconductor chip 6 and the carrier tape 1. After the encapsulant 15 has been completely sucked into the region between the chip 6 and carrier tape 1, the encapsulant 15 cures and produces a fixed connection between the chip 6 and the carrier tape 1. In order to carry out the method according to the invention, a retainer plate 16 is provided on which the carrier tape 1 is configured.

We claim:

1. A method for mounting a semiconductor chip on a carrier layer, which comprises:

providing a semiconductor chip having a first edge section and a second edge section;

providing a carrier layer;

placing the semiconductor chip on the carrier layer;

forming a duct between the semiconductor chip and the carrier layer for allowing the filler material to flow therein;

forming the duct by linearly applying duct material in a region between the semiconductor chip and the carrier layer; and using a partial vacuum to apply pressure to filler material, being the same as the duct material, to convey the filler material from the first edge section of the semiconductor chip to the second edge section of the semiconductor chip.

2. The method according to claim 1, wherein:

the step of forming the duct is performed before the semiconductor chip is placed on the carrier layer; and the duct material is linearly applied to a side selected from the group consisting of a side of the semiconductor chip that will face the carrier layer and a side of the carrier layer that will face the semiconductor chip.

3. The method according to claim 1, wherein the duct material is applied at least partially in a continuous line.

4. The method according to claim 1, wherein the duct material is applied by using a printing method.

5. The method according to claim 1, wherein the duct material is applied by using a screen printing method.

* * * * *